United States Patent
Chen et al.

(10) Patent No.: US 10,605,373 B2
(45) Date of Patent: Mar. 31, 2020

(54) PRESSURE RELIEF DEVICE AND LIQUID COOLING SYSTEM

(71) Applicant: COOLER MASTER CO., LTD., New Taipei (TW)

(72) Inventors: Hsin-Hung Chen, New Taipei (TW);
Shih-Wei Huang, New Taipei (TW);
Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 579 days.

(21) Appl. No.: 14/954,258

(22) Filed: Nov. 30, 2015

(65) Prior Publication Data
US 2017/0079166 A1 Mar. 16, 2017

(30) Foreign Application Priority Data
Sep. 11, 2015 (CN) ..................... 2015 2 0703753 U

(51) Int. Cl.
*F16K 24/04* (2006.01)
*H05K 7/20* (2006.01)
(52) U.S. Cl.
CPC ......... *F16K 24/04* (2013.01); *H05K 7/20327* (2013.01); *H05K 7/20772* (2013.01)

(58) Field of Classification Search
CPC ......... F16L 55/07; F16L 55/055; F16K 24/04; H05K 7/20327; H05K 7/20772
See application file for complete search history.

(56) References Cited

U.S. PATENT DOCUMENTS

| 912,502 | A | * | 2/1909 | Squires | 138/31 |
| 1,244,271 | A | * | 10/1917 | Witter | 138/31 |
| 3,893,486 | A | * | 7/1975 | Meyers | F15B 7/10 138/31 |
| 7,529,089 | B2 | * | 5/2009 | Cheng | G06F 1/20 165/104.21 |

FOREIGN PATENT DOCUMENTS

| TW | I349964 | 10/2011 |
| TW | 201423835 A | 6/2014 |
| TW | I471176 B | 2/2015 |

* cited by examiner

*Primary Examiner* — Jon T. Schermerhorn, Jr.
(74) *Attorney, Agent, or Firm* — Maschoff Brennan

(57) ABSTRACT

A pressure relief device is applied to a liquid cooling system. The pressure relief device includes an exhaust valve and a valve seat. The valve seat is connected with the exhaust valve to form a chamber. The valve seat has an inlet, an outlet and a protrusion. The inlet and the outlet are individually communicated with the chamber. The protrusion is located at the bottom of the valve seat and protrudes toward the exhaust valve. A liquid cooling system with the pressure relief device is also disclosed.

7 Claims, 9 Drawing Sheets

PRESSURE RELIEF DEVICE AND LIQUID COOLING SYSTEM

CROSS REFERENCE TO RELATED APPLICATIONS

This Non-provisional application claims priority under 35 U.S.C. § 119(a) on Patent Application No(s). 201520703753.9 filed in People's Republic of China on Sep. 11, 2015, the entire contents of which are hereby incorporated by reference.

BACKGROUND OF THE INVENTION

Field of Invention

The present disclosure relates to a pressure relief device and a liquid cooling system.

Related Art

For the conventional computer structure, the air cooling device can properly take the heat generated by the CPU away. However, the processing speed of CPU becomes faster and faster in the recent year, and the generated heat is also sufficiently increased. Besides, the size of the air cooling system is also limited by the dimension of the case of the computer. Accordingly, the efficiency of the air cooling system cannot be promptly enhanced to solve the heat dissipation issue. Moreover, the fan of the air cooling system will generate loudly annoying noise in high-speed operation. Thus, it is desired to provide another solution, such as a liquid cooling device, with higher heat-dissipation efficiency and lower noise.

The liquid cooling device utilizes a fluid (e.g. water) as the coolant to carry the heat generated by CPU and GPU by proper heat exchange. However, the fluid usually contains air, so the pressure of pipes will become too large as the liquid cooling device is under operation. This high pressure may lower the operation performance and cause the damage of the cooling device.

SUMMARY OF THE INVENTION

An objective of the present invention is to provide a pressure relief device and a liquid cooling system that can discharge the air contained in the pipe of the liquid cooling system, thereby increasing the heat-dissipation efficiency of the liquid cooling system.

To achieve the above, the present invention discloses a pressure relief device applied to a liquid cooling system. The pressure relief device includes an exhaust valve and a valve seat. The valve seat is connected with the exhaust valve to form a chamber. The valve seat has an inlet, an outlet and a protrusion. The inlet and the outlet are individually communicated with the chamber, and the protrusion is located at the bottom of the valve seat and protrudes toward the exhaust valve.

To achieve the above, the present invention discloses another pressure relief device applied to a liquid cooling system. The pressure relief device includes an exhaust valve and a valve seat. The valve seat is connected with the exhaust valve to form a chamber. The valve seat has an inlet and an outlet, and the inlet and the outlet are misaligned with each other and individually communicated with the chamber.

In one embodiment, the exhaust valve has an exhaust portion, an elastic element, a first contact element and a link portion. The link portion is connected with the valve seat to form the chamber. The exhaust portion is disposed on the link portion to form an accommodating space. The elastic element and the first contact element are disposed in the accommodating space. The exhaust portion has a through hole for communicating the accommodating space and the chamber. The elastic element is mounted on one end of the first contact element, and the other end of the first contact element contacts the through hole.

In one embodiment, the exhaust portion further has an exhaust hole, and the exhaust valve further has a second contact element disposed at one end of the elastic element opposite to the first contact element and contacting the exhaust portion. The second contact element has a through hole disposed corresponding to the exhaust hole.

In one embodiment, the exhaust valve has an exhaust portion, an elastic body and a link portion, the exhaust portion is connected with the link portion, the elastic body is disposed on the link portion, and the exhaust valve is connected with the valve seat by the link portion.

In one embodiment, the exhaust portion has an exhaust hole, and the elastic body covers the exhaust hole.

In one embodiment, the inlet is disposed opposite to the outlet, and the protrusion is disposed between the inlet and the outlet.

In one embodiment, the inlet and the outlet are positioned at different horizontal levels in a vertical cross-section.

To achieve the above, the present invention also discloses a liquid cooling system including the above-mentioned pressure relief device, a liquid cooling head, a heat dissipation module and a plurality of fluid pipes. The liquid cooling head and the heat dissipation module are communicated by the fluid pipes, and the pressure relief device is installed in at least one of the fluid pipes for discharging air in the fluid pipes.

In one embodiment, the liquid cooling system further includes a pump and a storage tank. The pump is disposed between the liquid cooling head and the storage tank, and the storage tank is disposed between the pump and the heat dissipation module. The liquid cooling head, the pump, the storage tank and the heat dissipation module are communicated by the fluid pipes.

As mentioned above, in the pressure relief device and liquid cooling system of the invention, the valve seat is connected with the exhaust valve to form a chamber, the inlet and outlet of the valve seat are individually communicated with the chamber, and the protrusion is located at the bottom of the valve seat and protrudes toward the exhaust valve. Otherwise, the inlet and the outlet can be misaligned with each other. When the fluid flows to the inlet of the pressure relief device through the pipes and then enters the chamber, the fluid contains air can stay in the chamber for a longer period. Accordingly, the liquid fluid and the contained air can be separated in the chamber, and then separated air accumulated in the chamber can be exhausted through the exhaust valve. This mechanism can properly decrease the pressure of the liquid cooling system so as to enhance the heat-dissipation efficiency thereof.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
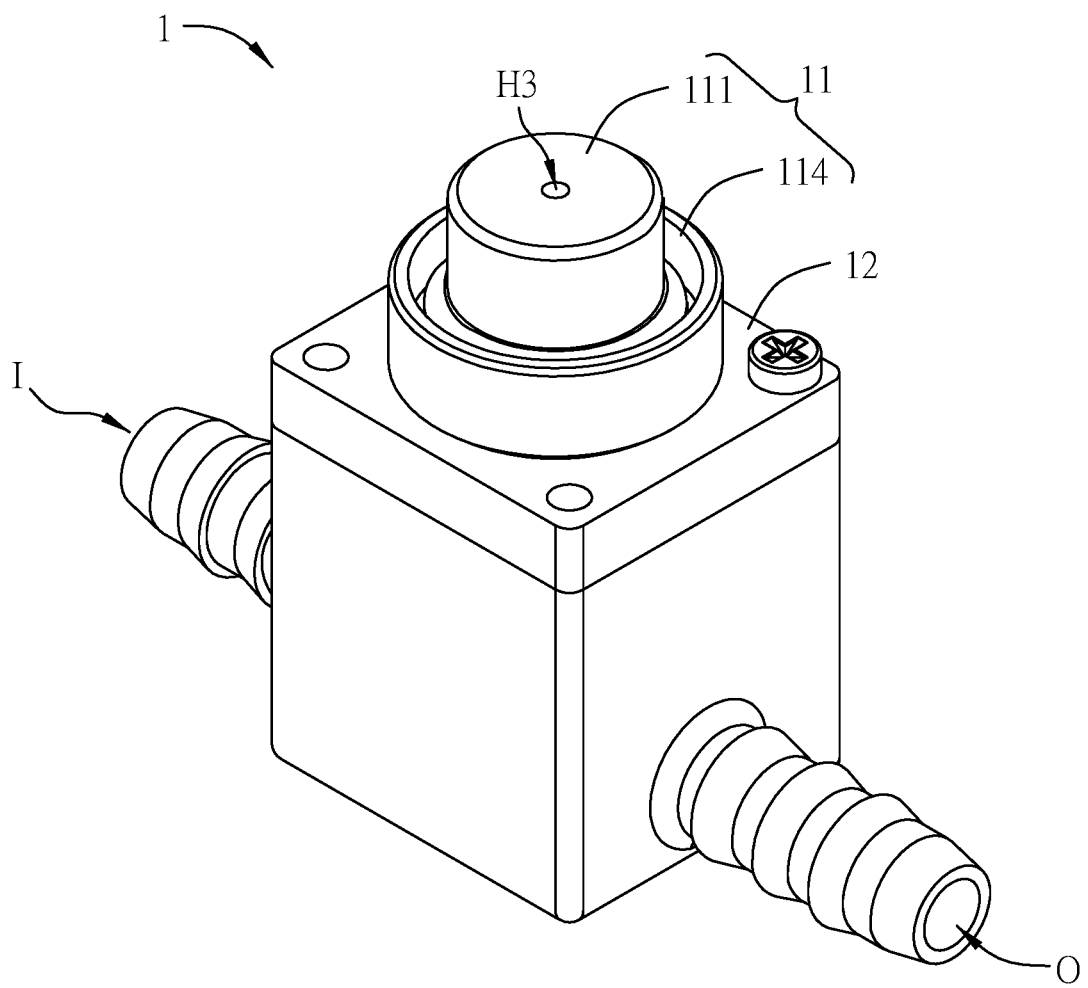
FIGS. 1A to 1C are a perspective view, an exploded view and a sectional view of a pressure relief device, respectively, according to an embodiment of the invention.
Figure 1B:
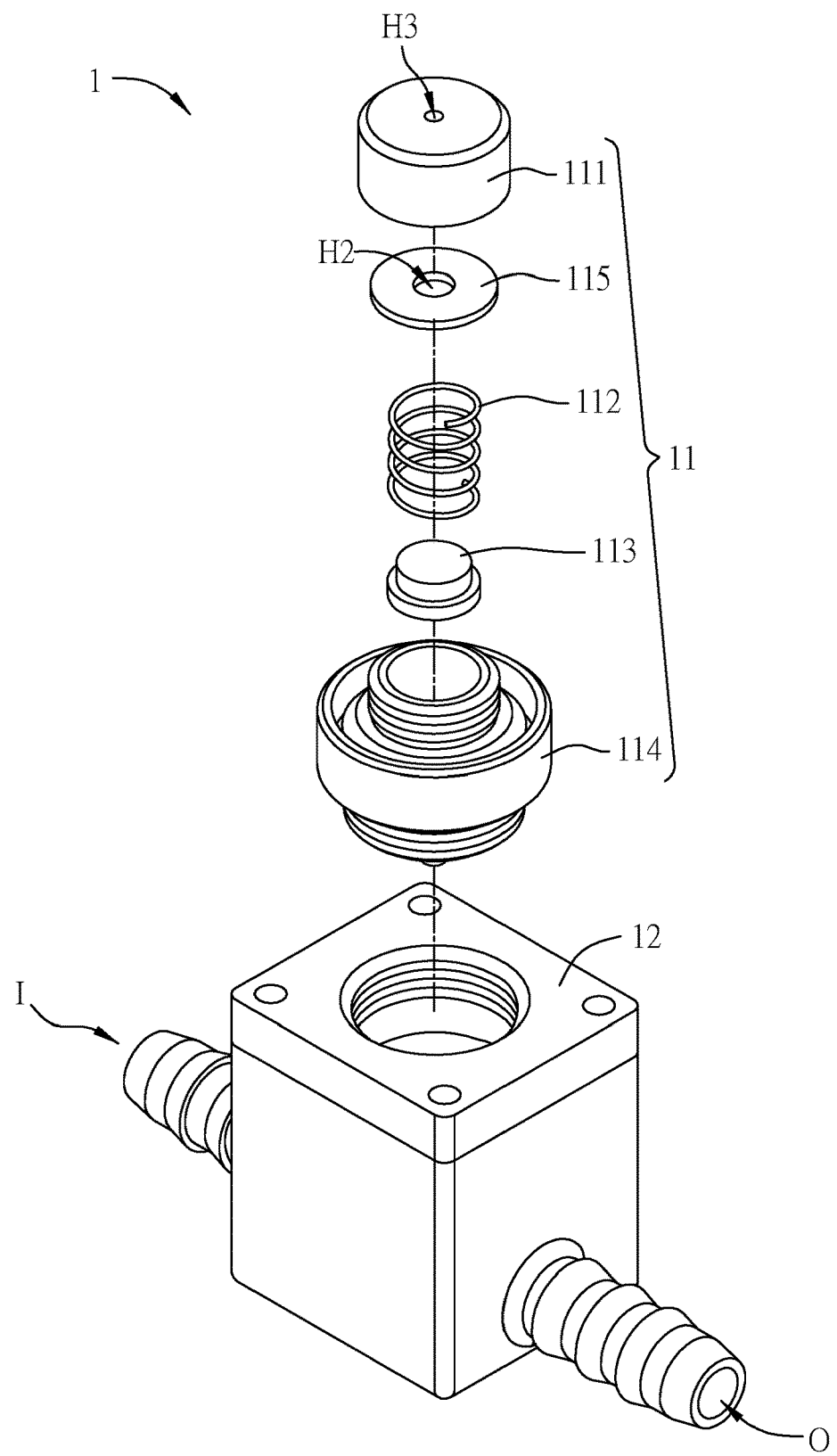
Figure 1C:
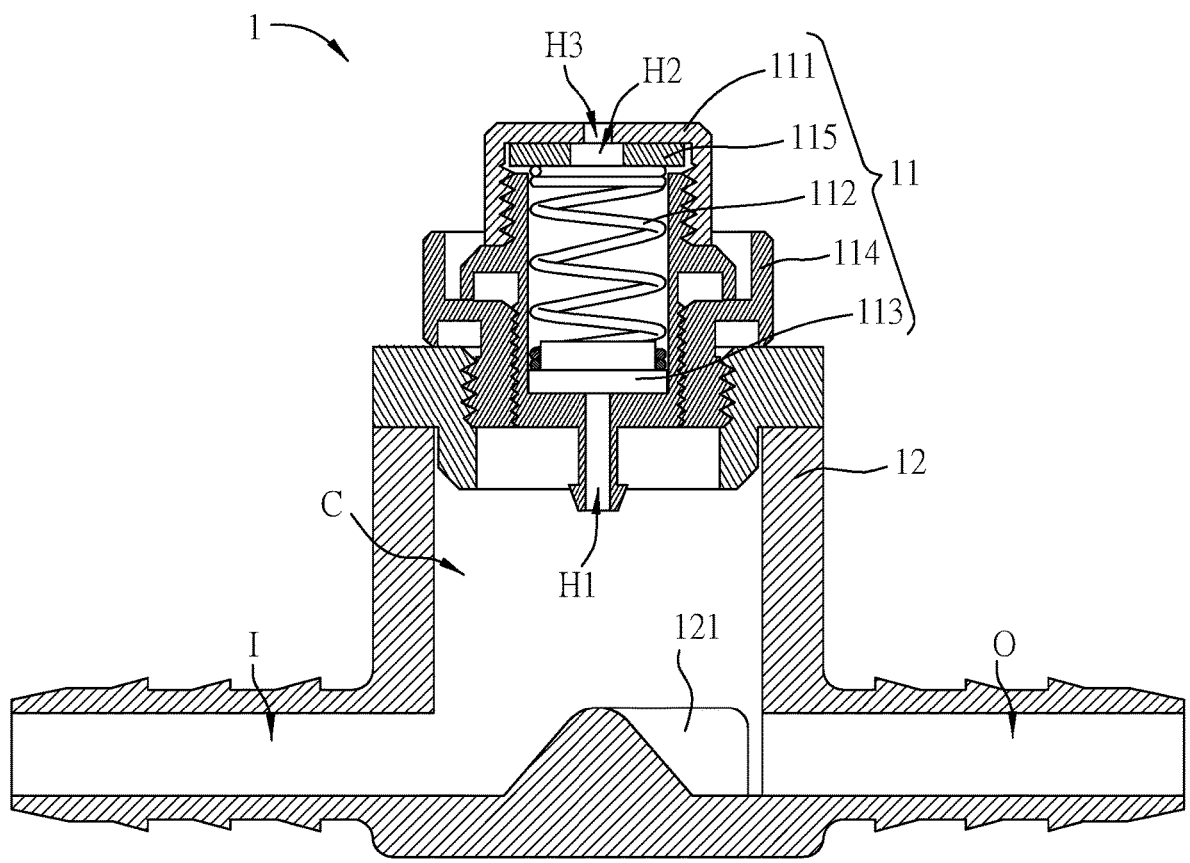

FIGS. 1A to 1C are a perspective view, an exploded view and a sectional view of a pressure relief device 1, respectively, according to an embodiment of the invention The pressure relief device 1 is applied to a liquid cooling system (or a liquid heat-dissipation device), which utilizes a fluid (e.g. a water coolant) to lower the temperature of a heat source such as a CPU or a GPU in a graphics card. The pressure relief device 1 is installed in the pipes of the liquid cooling system. When the pressure of the pipes is overloaded due to the air contained in the pipes, the pressure relief device 1 can discharge the air so as to decrease the pressure of the liquid cooling system, thereby enhancing the heat-dissipation efficiency of the system.

The pressure relief device 1 includes an exhaust valve 11 and a valve seat 12. The exhaust valve 11 is connected with the valve seat 12 to form a chamber C. In this embodiment, the exhaust valve 11 can be connected with the valve seat 12 by screwing, so the fluid can flow into and then exit the chamber C. In other embodiments, the exhaust valve 11 can also be connected with the valve seat 12 by fastening, adhering or hooking.

The valve seat 12 has an inlet I, an outlet O and a protrusion 121. The inlet I and the outlet O are individually communicated with the chamber C. In this embodiment, the inlet I and the outlet O of the valve seat 12 are located at two opposite sides of the valve seat 12, and individually communicated with the chamber C. In other embodiments, the inlet I and the outlet O can also be located at two adjacent sides, respectively, and this invention is not limited. In more detailed, the fluid can flow into the chamber C through the inlet I and leave the chamber C through the outlet O, so that the pipes can connect with the valve seat 12 via the inlet I and outlet O. The inlet I and the outlet O can be disposed at the same level or different levels. In this embodiment, the inlet I and the outlet O are disposed at the same level, which means that the inlet I is positioned corresponding and opposite to the outlet O. In other embodiments, the inlet I and the outlet O are disposed at different level, which means that the inlet I and the outlet O are misaligned. Besides, the protrusion 121 is located at the bottom of the valve seat 12 and protrudes toward the exhaust valve 11. In this embodiment, the protrusion 121 is disposed between the inlet I and the outlet O, and protrudes toward the exhaust valve 11.

The exhaust valve 11 has an exhaust portion 111, an elastic element 112, a first contact element 113, and a link portion 114. In this embodiment, the exhaust valve 11 further has a second contact element 115. The link portion 114 is connected with the valve seat 114 (e.g. by screwing) to form the chamber C. The exhaust portion 111 is disposed on the link portion 114 (e.g. by screwing) to form an accommodating space. The elastic element 112, the first contact element 113 and the second contact element 115 are disposed in the accommodating space. The bottom of the exhaust portion 111 is configured with a through hole H1 for communicating the accommodating space and the chamber C. In this embodiment, the elastic element 112 is a spring. One end of the elastic element 112 is mounted on one end of the first contact element 113, and the other end of the first contact element 113 contacts the through hole H1. When the pressure in the chamber C is smaller than the elastic force of the elastic element 112, the first contact element 113 can block the through hole H1.

The second contact element 115 is disposed at one end of the elastic element 112 opposite to the first contact element 113 and contacts the exhaust portion 111. In other words, the two ends of the elastic element 112 are connected to the first contact element 113 and the second contact element 115, respectively. The first contact element 113 contacts the through hole H1, and the second contact element 115 is located between the elastic element 112 and the exhaust portion 111. The second contact element 115 has a through hole H2, and the top of the exhaust portion 111 is configured with an exhaust hole H3. The through hole H1 and the exhaust hole H3 are located at two opposite sides of the exhaust portion 111, and the through hole H2 of the second contact element 115 is disposed corresponding to the exhaust hole H3 of the exhaust portion 111. That is, the through hole H2 is communicated with the exhaust hole H3.

Accordingly, when the fluid enters the chamber C of the pressure relief device 1 through the inlet I, the configuration of the protrusion 121 of the valve seat 12 can help to extend the retention time of the fluid containing air in the chamber C. This mechanism can improve the separation of the fluid and the contained air so as to achieve the purpose of air-fluid separation. In this embodiment, the included angle between the extension direction of the protrusion portion 121 and the extension direction of the inlet I and the included angle between the extension direction of the protrusion portion 121 and the extension direction of the outlet O are not 90 degrees, but this invention is not limited thereto. In other embodiments, the extension direction of the protrusion portion 121 can be substantially perpendicular to the extension direction of the inlet I and/or the outlet O. Accordingly, the separated air can be collected in the top portion of the chamber C (close to the exhaust valve 11). When the air pressure in the through H1 is larger than the force of the elastic element 112 pushing the first contact element 113, the collected air can push and lift the first contact element 113, thereby exhausting the air through the first contact element 113, the elastic element 112, the through hole H2 of the second contact element 115 and the exhaust hole H3. As a result, the pressure in the chamber C and the pipes can be released. After exhausting the air, the pressure in the chamber C can be lowered and smaller than the force of the elastic element 112 pushing the first contact element 113. Thus, the first contact element 113 moves downward so as to block the through hole H1 again.

Figure 2A:
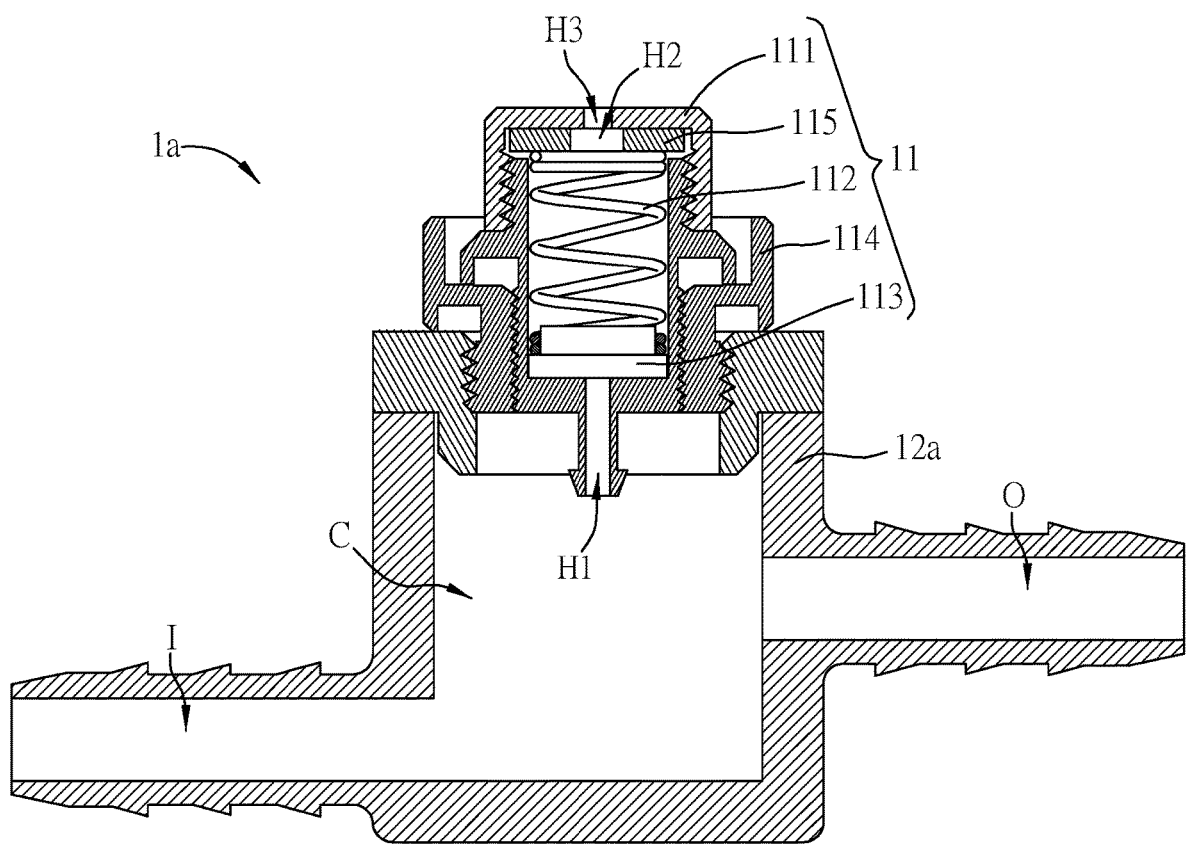
FIG. 2A is a sectional view of another aspect of the pressure relief device according to the embodiment of the invention.

FIG. 2A is a sectional view of another aspect of a pressure relief device 1a according to the embodiment of the invention.

The pressure relief device 1a includes an exhaust valve 11 and a valve seat 12a. In this case, the structure and operation of the exhaust valve 11 are disclosed in the above-mentioned pressure relief device 1, so the detailed description thereof will be omitted.

Different from the valve seat 12 of FIG. 1B, the valve seat 12a is not configured with the protrusion 121. Besides, the inlet I and the outlet O of the valve seat 12a of FIG. 2A are also disposed at two opposite sides and communicated with the chamber C. In other embodiments, the inlet I and the outlet O can also be disposed at two adjacent sides of the valve seat 12a. In this embodiment, the inlet I and the outlet O of the valve seat 12a are misaligned. In more specific, the inlet I and the outlet O can be misaligned in the vertical direction or the horizontal direction, so that they can be misaligned. With reference to FIG. 2A, the inlet I and the outlet O of the valve seat 12a are positioned at different horizontal levels (or different heights). Otherwise, the inlet I and the outlet O can also be positioned at different levels from the top view of the valve seat 12a. In other words, the inlet I and the outlet O can be vertically misaligned or horizontally misaligned, and this invention is not limited. Accordingly, when the fluid flows into the chamber C of the pressure relief device 1a through the inlet I, this misaligned design can extend the retention time of the fluid containing air in the chamber C. This mechanism can improve the separation of the fluid and the contained air so as to achieve the purpose of air-fluid separation. In this case, the separated air can be collected around the exhaust valve 11. Moreover, if the gap between the levels of the inlet I and the outlet O increases, the retention time of the fluid in the chamber C becomes longer.

The other technical features of the pressure relief device 1a can be referred to the same components of the previous mentioned pressure relief device 1, so the detailed description thereof will be omitted.

Figure 2B:
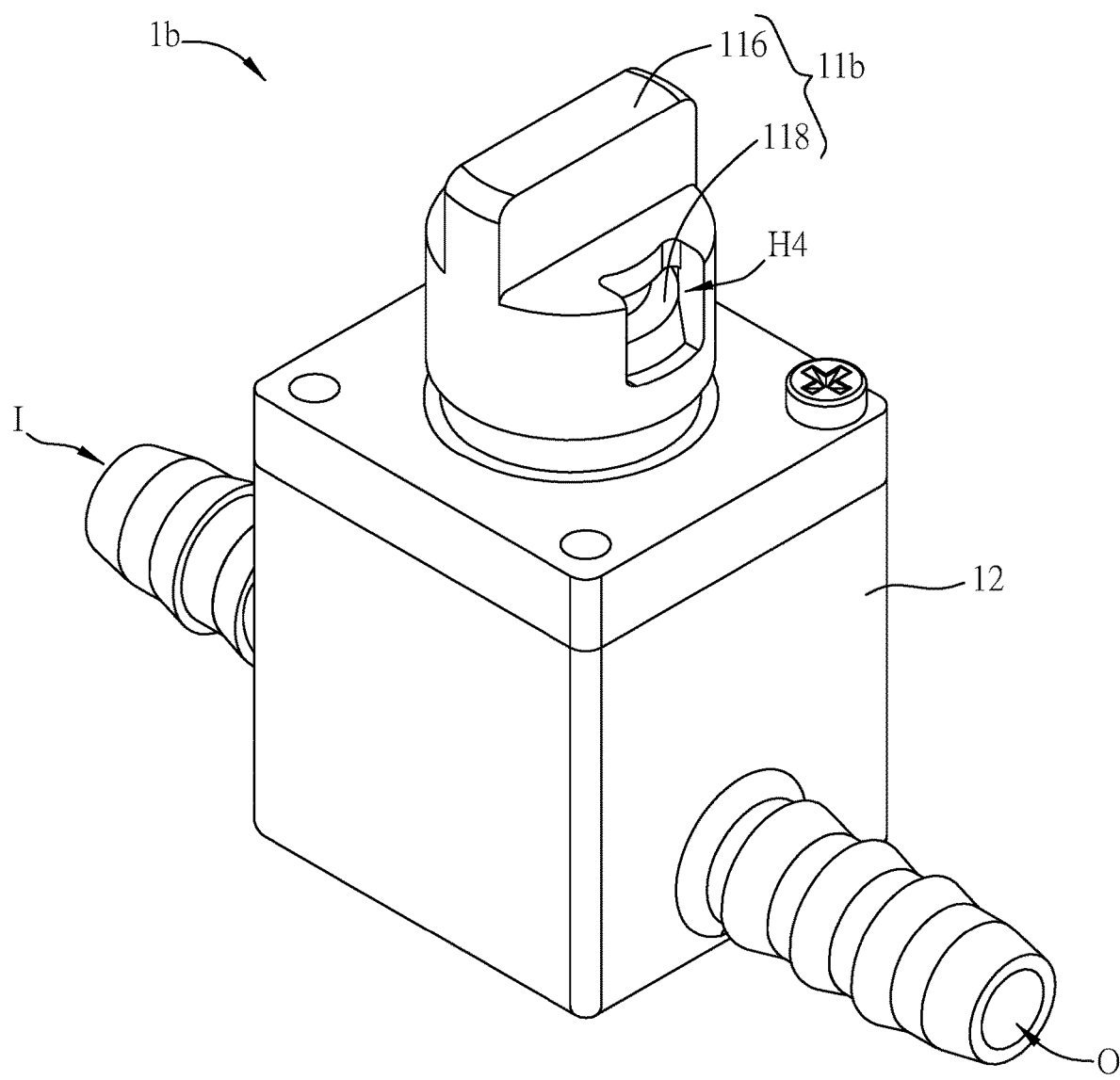
FIGS. 2B and 2C are a perspective view and an exploded view of another aspect of the pressure relief device, respectively, according to the embodiment of the invention.
Figure 2C:
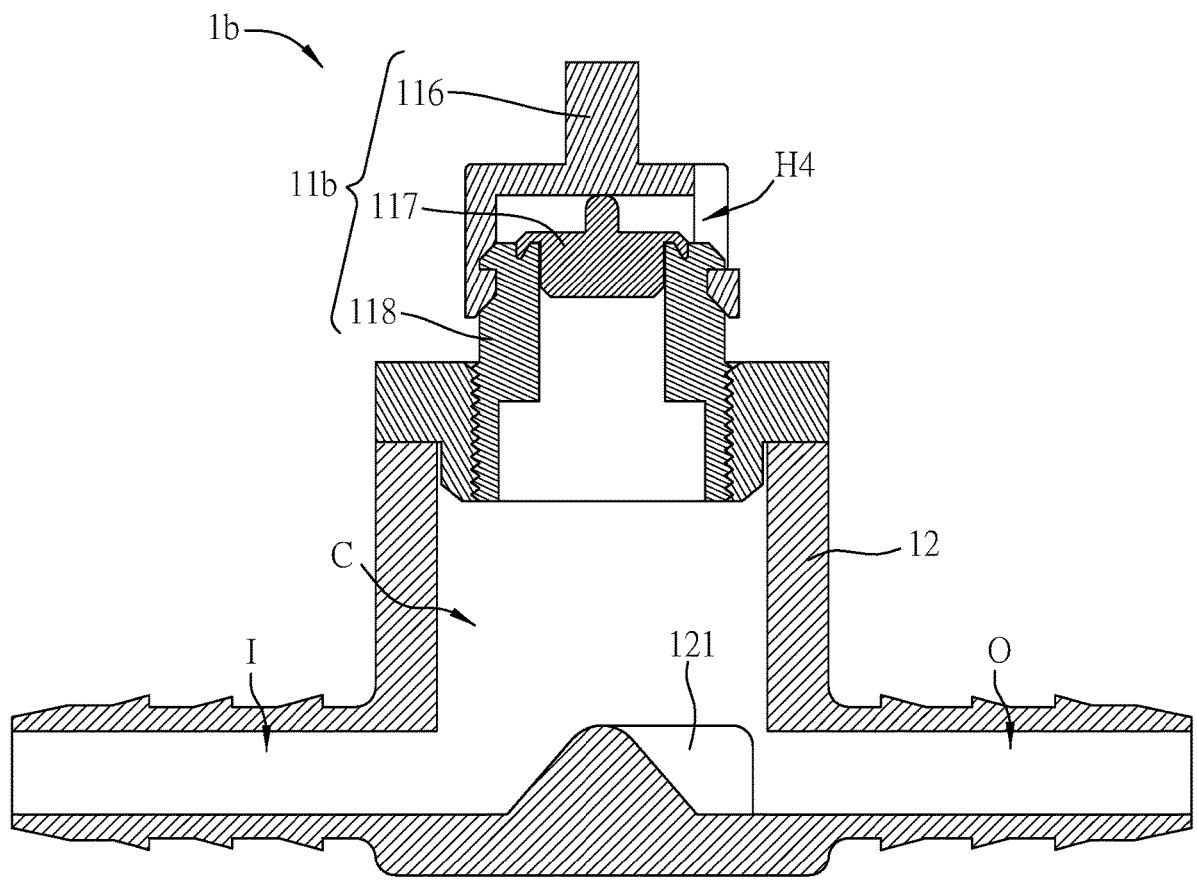

FIGS. 2B and 2C are a perspective view and an exploded view of another aspect of a pressure relief device 1b, respectively, according to the embodiment of the invention.

The pressure relief device 1b includes an exhaust valve 11b and a valve seat 12. In this case, the structure valve seat 12 is disclosed in the above-mentioned pressure relief device 1, so the detailed description thereof will be omitted.

Different from the exhaust valve 11 of FIG. 1B, the exhaust valve 11b of FIG. 2C includes an exhaust portion, 116, an elastic body 117 and a link portion 118. The exhaust portion 116 is connected with the link portion 118 by, for example but not limited to, fit connecting. In addition, the elastic body 117 is disposed on the link portion 118, and the exhaust valve 116 is connected with the valve seat 12 by the link portion 118 so as to form the chamber C. The link portion 118 and the valve seat 12 can be connected by fit connecting, screwing or adhering. In this embodiment, the link portion 118 and the valve seat 12 can be connected by screwing. Besides, the elastic body 117 of this embodiment can be made of, for example but not limited to, rubber.

In this embodiment, the exhaust portion 116 has an exhaust hole H4, which is disposed at a side surface of the exhaust portion 116. The elastic body 117 blocks the exhaust hole H4. The other technical features of the pressure relief device 1b can be referred to the same components of the above-mentioned pressure relief device 1, so the detailed description thereof will be omitted.

In this embodiment, when the air pressure in the chamber C increases, it can push the elastic body 117 upwardly so as to expose the exhaust hole H4. Accordingly, the air in the chamber C can be discharged through the exhaust hole H4. After the air is discharged, the pressure in the chamber C is lowered, so the elastic body 117 returns to the original position and blocks the exhaust hole H4 again.

Figure 2D:
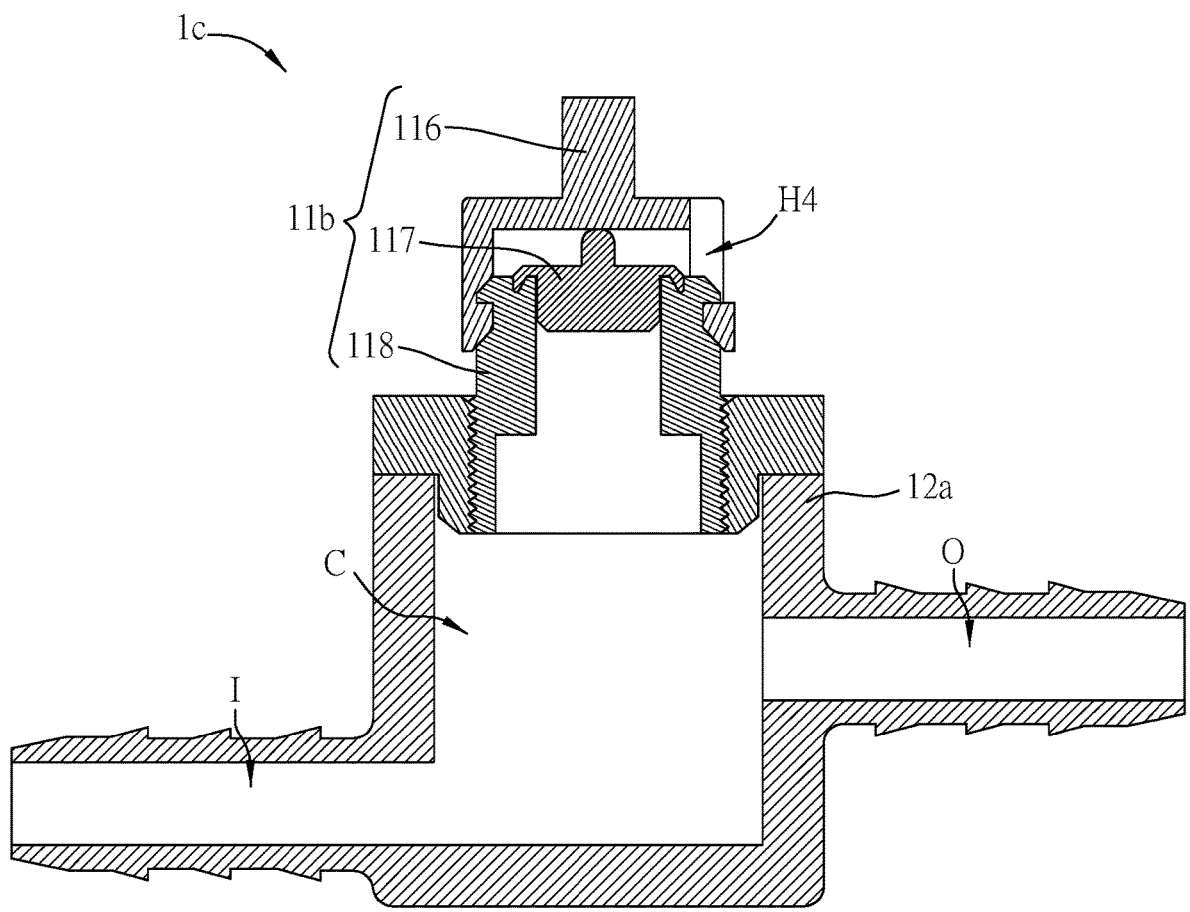
FIG. 2D is a sectional view of another aspect of the pressure relief device according to the embodiment of the invention.

FIG. 2D is a sectional view of another aspect of a pressure relief device 1c according to the embodiment of the invention.

The pressure relief device 1c of FIG. 2D includes an exhaust valve 11b and a valve seat 12a. In this case, the exhaust valve 11b and the valve seat 12a have been described in the above embodiments, so the detailed descriptions thereof will be omitted.

Figure 3A:
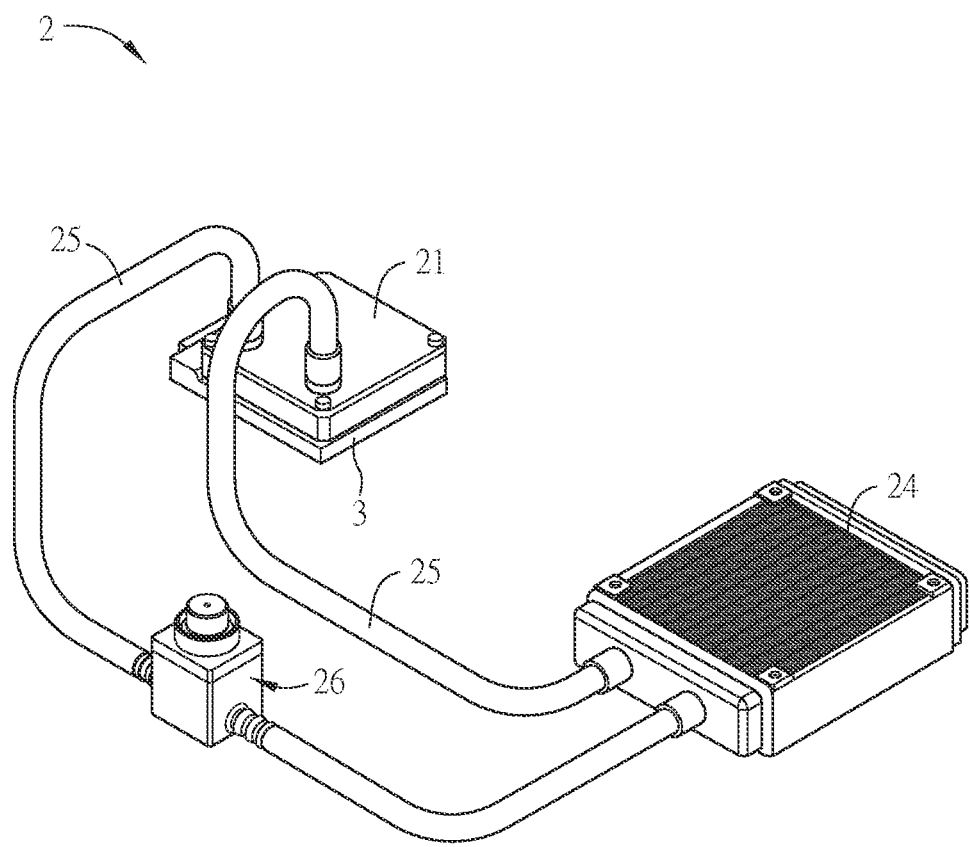
FIGS. 3A and 3B are schematic diagrams of different aspects of a liquid cooling system according to the embodiment of the invention.

FIG. 3A is a schematic diagram of a liquid cooling system 2 according to the embodiment of the invention.

The liquid cooling system 2 can decrease the temperature of a heat source (e.g. a CPU or a GPU in graphic card). In this embodiment, the liquid cooling system 2 includes a liquid cooling head 21, a heat dissipation module 24, a plurality of fluid pipes 25, and at least one pressure relief device 26. The liquid cooling head 21, the heat dissipation module 24 and the pressure relief device 26 are communicated by the fluid pipes 25 so as to form a loop, so that the fluid, which is for example but not limited to water, can cyclically flow in the loop of the liquid cooling head 21, the heat dissipation module 24 and the pressure relief device 26. The pressure relief device 26 can be installed in at least one of the fluid pipes 25 for discharging air in the fluid pipes 25.

In practice, the liquid cooling head 21 (the lower surface of the liquid cooling head 21) of the liquid cooling system 2 can be attached to an electronic device 3 (e.g. a CPU or a GPU in graphic card). The fluid pipes 25 can communicate the liquid cooling head 21, the heat dissipation module 24 and the pressure relief device 26 so as to form a loop, so that the fluid can cyclically flow in the loop of the liquid cooling head 21, the heat dissipation module 24 and the pressure relief device 26 for carry the heat of the electronic device 3 away. In this embodiment, the pressure relief device 26 is installed in, for example but not limited to, at least one of the fluid pipes 25 between the liquid cooling heat 21 and a storage tank 23 for discharging air in the fluid pipes 25 of the liquid cooling system 2. Accordingly, the pressure of the liquid cooling system 2 can be decreased so as to enhance the heat-dissipation efficiency thereof. In other embodiments, it is also possible to configure two pressure relief devices 26 in two fluid pipes 25, respectively, and this invention is not limited.

The pressure relief device 26 of this embodiment can be anyone of the above-mentioned pressure relief devices 1, 1a, 1b and 1c or their modifications. The structures and operations thereof have been described in the above embodiments, so the detailed descriptions thereof will be omitted.

Figure 3B:
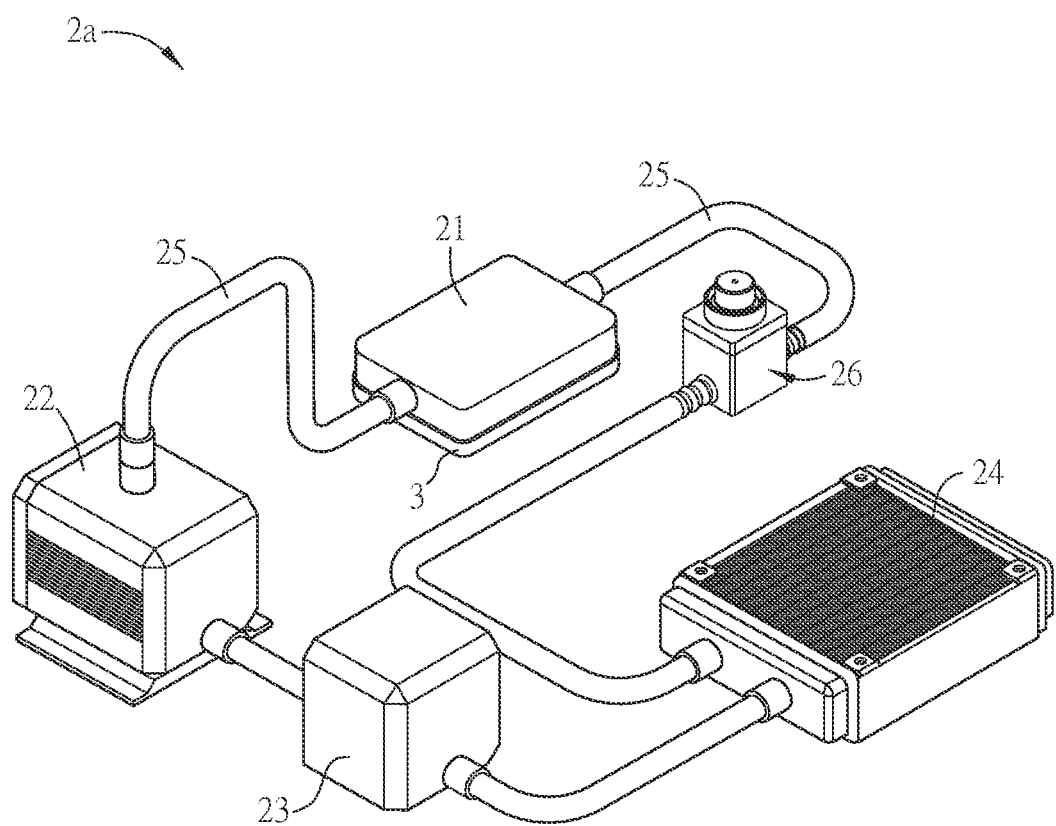

FIG. 3B is a schematic diagram of another liquid cooling system 2a according to the embodiment of the invention.

Excepting the liquid cooling head 21, the heat dissipation module 24, the fluid pipes 25, and the pressure relief device 26, the liquid cooling system 2a further includes a pump 22 and a storage tank 23. The pump 22 is disposed between the liquid cooling head 21 and the storage tank 23, and the storage tank 23 is disposed between the pump 22 and the heat dissipation module 24. The liquid cooling head 21, the pump 22, the storage tank 23, the heat dissipation module 24 and the pressure relief device 26 are communicated by the fluid pipes 25. Accordingly, the fluid can cyclically flow between the liquid cooling head 21, the pump 22, the storage tank 23, the heat dissipation module 24 and the pressure relief device 26 for carrying the heat of the electronic device 3 away. In other embodiments, the liquid cooling head 21 and the pump 22 can be combined as a single component.

In this embodiment, the pressure relief device 26 can be disposed in, for example but not limited to, the fluid pipe 25 between the liquid cooling head 21 and the storage tank 23 for discharging the air in the pipes 25 of the liquid cooling system 2a. This configuration can lower the pressure of the liquid cooling system 2a so as to enhance the heat-dissipation efficiency thereof.

The other technical features of the liquid cooling system 2a can be referred to the same components of the above-mentioned liquid cooling system 2, so the detailed descriptions thereof will be omitted.

To sum up, in the pressure relief device and liquid cooling system of the invention, the valve seat is connected with the exhaust valve to form a chamber, the inlet and outlet of the valve seat are individually communicated with the chamber, and the protrusion is located at the bottom of the valve seat and protrudes toward the exhaust valve. Otherwise, the inlet and the outlet can be misaligned with each other. When the fluid flows to the inlet of the pressure relief device through the pipes and then enters the chamber, the fluid contains air can stay in the chamber for a longer period. Accordingly, the liquid fluid and the contained air can be separated in the chamber, and then separated air accumulated in the chamber can be exhausted through the exhaust valve. This mechanism can properly decrease the pressure of the liquid cooling system so as to enhance the heat-dissipation efficiency thereof.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A pressure relief device applied to a liquid cooling system, comprising:
   an exhaust valve, wherein the exhaust valve has a through hole; and
   a valve seat connected with the exhaust valve to form a chamber, wherein the valve seat has an inlet, an outlet and a protrusion, the inlet and the outlet are individually communicated with the chamber, and the protrusion is located at the bottom of the valve seat and protrudes toward the through hole;
   wherein the exhaust valve has an exhaust portion, an elastic component, a movable block, a link portion and a mounting block, the link portion is connected with the valve seat to form the chamber, the link portion has an accommodating space and an opening connected to the accommodating space, the exhaust portion is disposed at the opening, the elastic component and the movable block are disposed in the accommodating space of the link portion, the through hole is formed in the link portion and is in fluid communication with the accommodating space and the chamber, the elastic component is mounted on and in direct contact with one end of the movable block, the movable block is pushed by the elastic component such that the other end of the movable block rests against the link portion and blocks the through hole, the mounting block is disposed at one end of the elastic component opposite to the movable block, the mounting block is located between the opening of the link portion and the exhaust portion, and the mounting block is pushed by the elastic component to rest against the exhaust portion;
   wherein an outer diameter of the mounting block is smaller than an inner diameter of the exhaust portion, and the outer diameter of the mounting block is larger than a diameter of the accommodating space.

2. The pressure relief device of claim 1, wherein the exhaust portion has an exhaust hole, and the mounting block has a through hole disposed corresponding to the exhaust hole.

3. The pressure relief device of claim 1, wherein the inlet is disposed opposite to the outlet, and the protrusion is disposed between the inlet and the outlet.

4. A liquid cooling system, comprising:
   a pressure relief device comprising an exhaust valve and a valve seat, wherein the exhaust valve has a through hole, the valve seat is connected with the exhaust valve to form a chamber, the valve seat has an inlet, an outlet and a protrusion, the inlet and the outlet are individually communicated with the chamber, and the protrusion is located at the bottom of the valve seat and protrudes toward the through hole;
   a heat exchanger;
   a heat dissipation module; and
   a plurality of fluid pipes, wherein the heat exchanger and the heat dissipation module each are connected to the fluid pipes such that the heat exchanger and the heat dissipation module are in fluid communication, and the pressure relief device is connected between two of the fluid pipes;
   wherein the exhaust valve has an exhaust portion, an elastic component, a movable block, a link portion and a mounting block, the link portion is connected with the valve seat to form the chamber, the link portion has an accommodating space and an opening connected to the accommodating space, the exhaust portion is disposed at the opening, the elastic component and the movable block are disposed in the accommodating space of the link portion, the through hole is formed in the link portion and is in fluid communication with the accommodating space and the chamber, the elastic component is mounted on and in direct contact with one end of the movable block, the movable block is pushed by the elastic component such that the other end of the movable block rests against the link portion and blocks the through hole, the mounting block is disposed at one end of the elastic component opposite to the movable block, the mounting block is located between the opening of the link portion and the exhaust portion, and the mounting block is pushed by the elastic component to rest against the exhaust portion;
   wherein an outer diameter of the mounting block is smaller than an inner diameter of the exhaust portion, and the outer diameter of the mounting block is larger than a diameter of the accommodating space.

5. The liquid cooling system of claim 4, further comprising:
   a pump; and
   a storage tank, wherein the pump is disposed between the heat exchanger and the storage tank, the storage tank is disposed between the pump and the heat dissipation module, and the heat exchanger, the pump, the storage tank and the heat dissipation module each are connected to the fluid pipes such that the heat exchanger, the pump, the storage tank and the heat dissipation module are in fluid communication.

6. The liquid cooling system of claim 4, wherein the exhaust portion has an exhaust hole, and the mounting block has a through hole disposed corresponding to the exhaust hole.

7. The liquid cooling system of claim 4, wherein the inlet is disposed opposite to the outlet, and the protrusion is disposed between the inlet and the outlet.

* * * * *